(12) United States Patent
Huang

(10) Patent No.: US 12,310,084 B2
(45) Date of Patent: May 20, 2025

(54) SEMICONDUCTOR DEVICE WITH ASSISTANT CAP AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 436 days.

(21) Appl. No.: 17/892,681

(22) Filed: Aug. 22, 2022

(65) Prior Publication Data

US 2024/0063285 A1    Feb. 22, 2024

(51) Int. Cl.
*H10D 64/62* (2025.01)
*H10D 64/01* (2025.01)

(52) U.S. Cl.
CPC ............ *H10D 64/62* (2025.01); *H10D 64/01* (2025.01)

(58) Field of Classification Search
None
See application file for complete search history.

(56) References Cited

U.S. PATENT DOCUMENTS

| | | | |
|---|---|---|---|
| 2008/0093591 A1* | 4/2008 | Khang | H10N 70/8825 257/E47.001 |
| 2020/0286836 A1 | 9/2020 | Jezewski et al. | |
| 2020/0373308 A1* | 11/2020 | Tsai | H10B 12/482 |
| 2022/0199468 A1 | 6/2022 | Jun et al. | |
| 2024/0063286 A1* | 2/2024 | Huang | H01L 29/401 |

FOREIGN PATENT DOCUMENTS

TW    201926576 A    7/2019

* cited by examiner

*Primary Examiner* — Daniel Whalen
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a first impurity region positioned in the substrate; a first dielectric layer positioned on the substrate; a first contact including a buried portion positioned along the first dielectric layer and on the first impurity region, and a protruding portion positioned on the buried portion and protruding from the first dielectric layer; a first top assistant cap covering the protruding portion; and a first top conductive layer positioned on the first top assistant cap. The first top assistant cap includes germanium or silicon germanium.

13 Claims, 17 Drawing Sheets

SEMICONDUCTOR DEVICE WITH ASSISTANT CAP AND METHOD FOR FABRICATING THE SAME

TECHNICAL FIELD

The present disclosure relates to a semiconductor device and a method for fabricating the semiconductor device, and more particularly, to a semiconductor device with an assistant cap and a method for fabricating the semiconductor device with the assistant cap.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first impurity region positioned in the substrate; a first dielectric layer positioned on the substrate; a first contact including a buried portion positioned along the first dielectric layer and on the first impurity region, and a protruding portion positioned on the buried portion and protruding from the first dielectric layer; a first top assistant cap covering the protruding portion; and a first top conductive layer positioned on the first top assistant cap. The first top assistant cap includes germanium or silicon germanium.

Another aspect of the present disclosure provides a semiconductor device including a substrate; a plurality of impurity regions separately positioned in the substrate; a first dielectric layer positioned on the substrate; a plurality of contacts including a plurality of buried portions positioned along the first dielectric layer and respectively correspondingly on the plurality of impurity regions, and a plurality of protruding portions respectively correspondingly positioned on the plurality of buried portions and protruding from the first dielectric layer; a plurality of top assistant caps respectively correspondingly covering the plurality of protruding portions; and a first top conductive layer positioned on the plurality of top assistant caps. The plurality of top assistant caps include germanium or silicon germanium.

Another aspect of the present disclosure provides a method for fabricating a semiconductor device including providing a substrate; forming a first impurity region in the substrate; forming a first dielectric layer on the substrate; forming a first contact and including a buried portion in the first dielectric layer and on the first impurity region, and a protruding portion in the first dielectric layer and on the buried portion; recessing the first dielectric layer to expose the protruding portion; forming a first top assistant cap covering the protruding portion; and forming a first top conductive layer on the first top assistant cap. The first top assistant cap includes germanium or silicon germanium.

Due to the design of the semiconductor device of the present disclosure, the resistance between the first top conductive layer and the plurality of contacts may be reduced by employing the plurality of top assistant caps. In addition, the resistance between the plurality of impurity regions and the plurality of contacts may be reduced by employing the plurality of bottom assistant layers. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
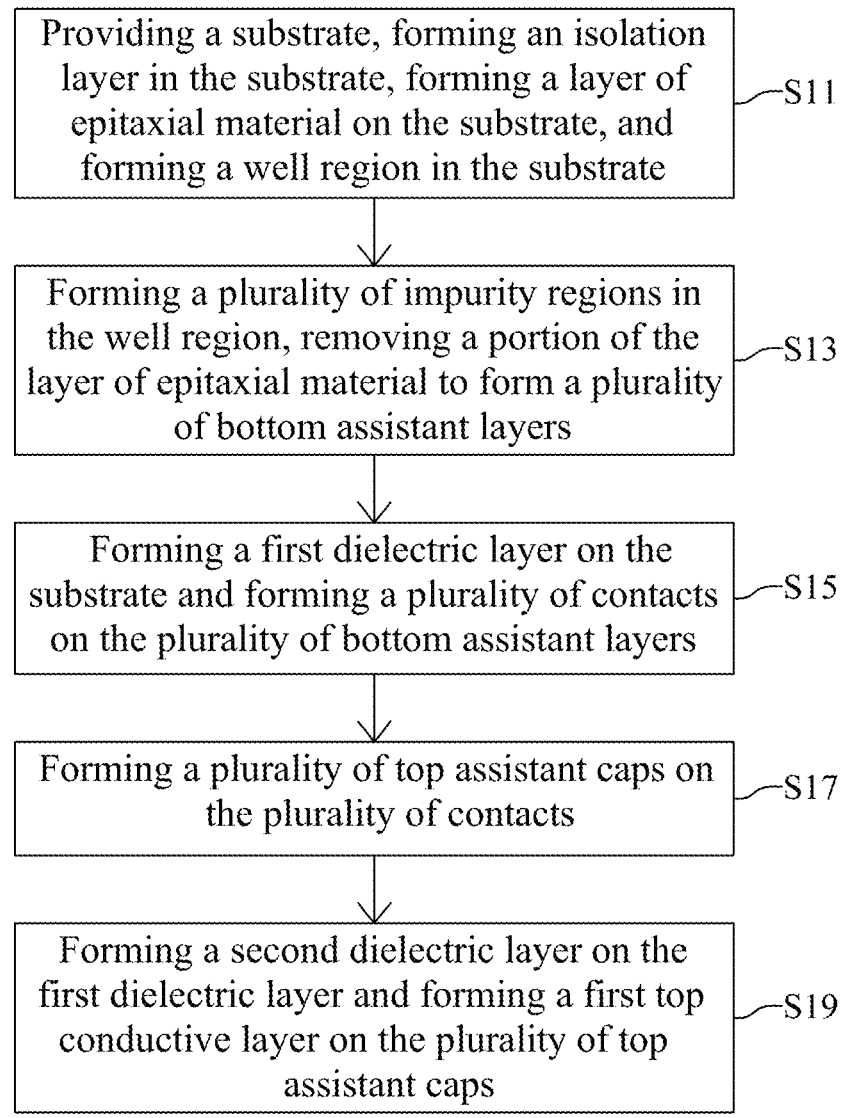
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

FIG. 1 illustrates, in a flowchart diagram form, a method 10 for fabricating a semiconductor device 1A in accordance with one embodiment of the present disclosure. FIGS. 2 to 14 illustrate, in schematic cross-sectional view diagrams, a flow for fabricating the semiconductor device 1A in accordance with one embodiment of the present disclosure.

Figure 2:
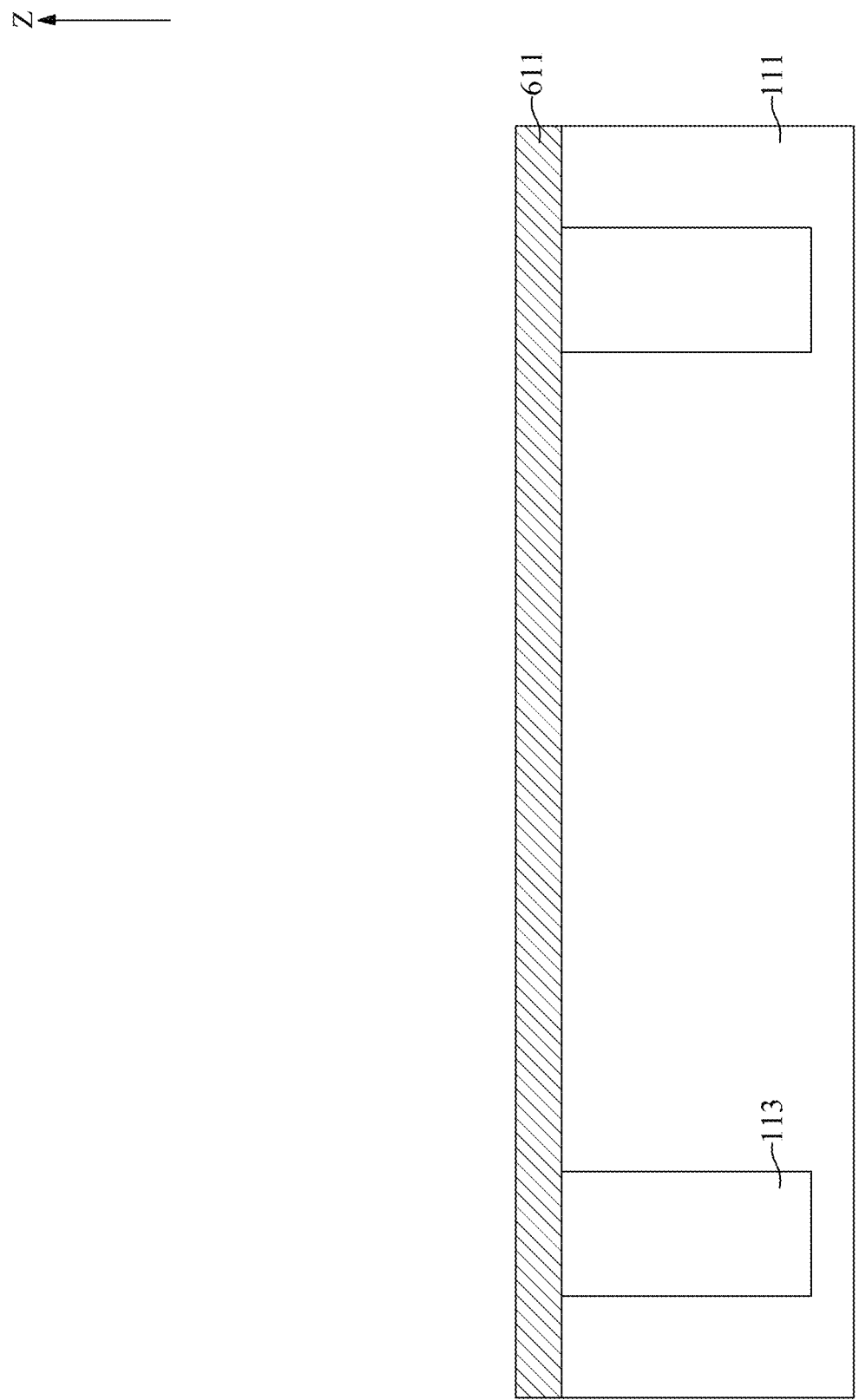
FIGS. 2 to 14 illustrate, in schematic cross-sectional view diagrams, a flow for fabricating the semiconductor device in accordance with one embodiment of the present disclosure.
Figure 3:
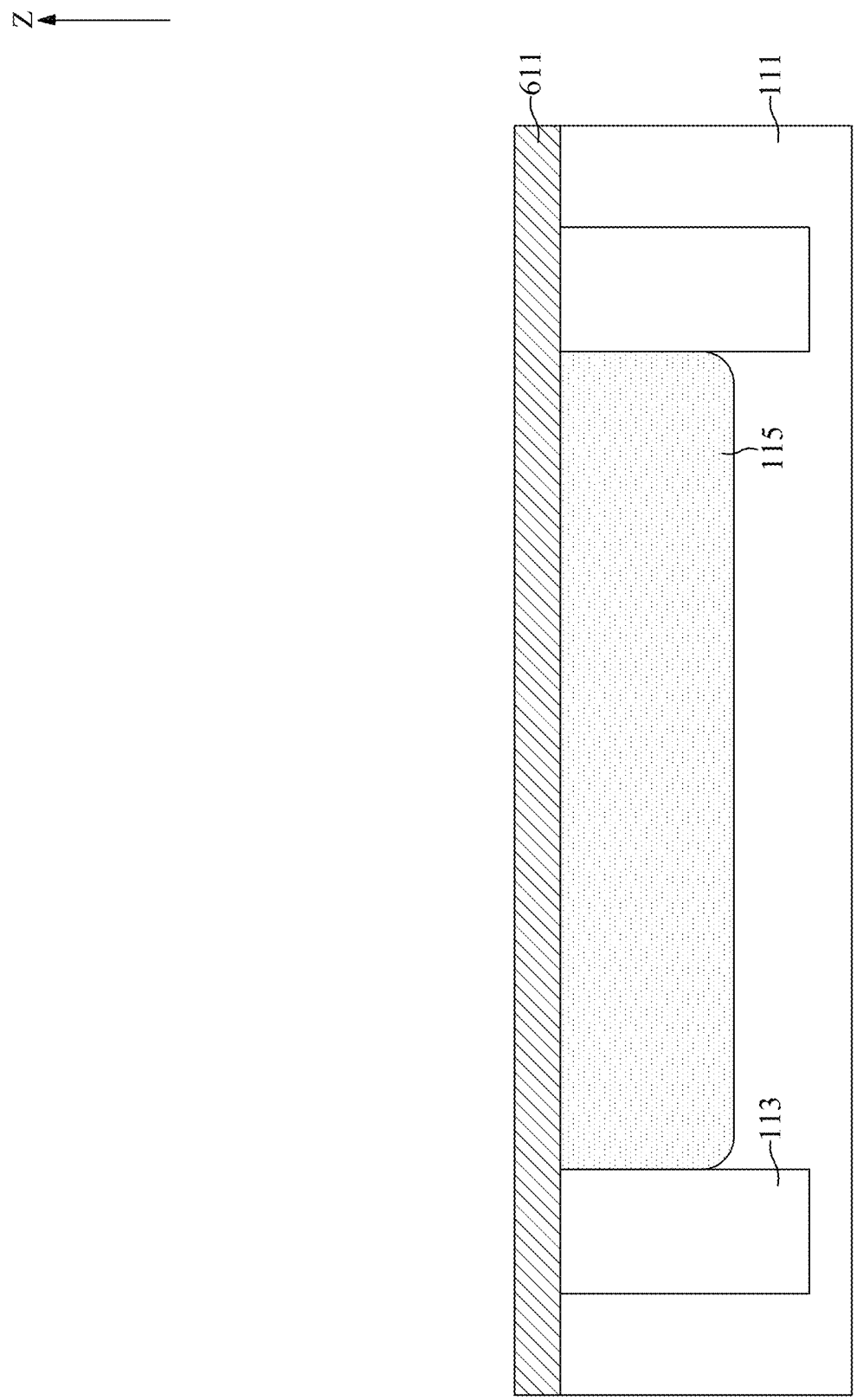

With reference to FIGS. 1 to 3, at step S11, a substrate 111 may be provided, an isolation layer 113 may be formed in the substrate 111, a layer of epitaxial material 611 may be formed on the substrate 111, and a well region 115 may be formed in the substrate 111.

With reference to FIG. 2, in some embodiments, the substrate 111 may be a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 111 may include a semiconductor-on-insulator structure which consists of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the isolation layer 113 may be formed in the substrate 111. A series of deposition processes may be performed to deposit a pad oxide layer (not shown in FIG. 2) and a pad nitride layer (not shown in FIG. 2) on the substrate 111. A photolithography process may be performed to define the position of the isolation layer 113. After the photolithography process, an etch process, such as an anisotropic dry etch process, may be performed to form trenches (not shown in FIG. 2) penetrating through the pad oxide layer, the pad nitride layer, and extending to the substrate 111. An insulating material may be deposited into the trenches and a planarization process, such as chemical mechanical polishing, may be subsequently performed to remove excess filling material until the top surface of the substrate 111 is exposed so as to form the isolation layer 113. The top surface of the isolation layer 113 and the top surface of the substrate 111 may be substantially coplanar. In some embodiments, the isolation layer 113 may define an active region (not separately shown in FIG. 2).

With reference to FIG. 2, the layer of epitaxial material 611 may be formed on the substrate 111 to completely cover the top surface of the substrate 111. In some embodiments, the epitaxial material 611 may be, for example, silicon, germanium, or silicon germanium.

Generally, the layer of epitaxial material 611 may be formed by a deposition process that includes exposing the top surface of the substrate 111 to a deposition gas containing at least a silicon source and a carrier gas. The deposition gas may also include a germanium source or a carbon source, as well as a dopant source.

Detailedly, the deposition process may begin by adjusting the process chamber containing the substrate 111 to a predetermined temperature and pressure. The temperature may be tailored to the particular conducted process. In some embodiments, the process chamber may be kept at a temperature in the range from about 250° C. to about 1000° C., from about 500° C. to about 800° C., or from about 550° C. to about 750° C. The appropriate temperature to conduct deposition process may depend on the particular precursors used to deposit the layer of epitaxial material 611. In some embodiments, the process chamber may be usually maintained at a pressure from about 0.1 Torr to about 200 Torr, or from about 1 Torr to about 50 Torr. The pressure may fluctuate during the deposition process but is generally maintained constant.

After the process chamber is tuned to the appropriate temperature and pressure, the substrate 111 may be exposed to the deposition gas containing the silicon source and the carrier gas to form the layer of epitaxial material 611. In some embodiments, the substrate 111 may be exposed to the deposition gas for a period of time of about 0.5 seconds to about 30 seconds, from about 1 second to about 20 seconds, or from about 5 seconds to about 10 seconds. The specific exposure time of the deposition process may be determined in relation to the particular precursors, temperature, and pressure used in the deposition process.

In some embodiments, the deposition gas for depositing the layer of epitaxial material 611 may include at least the silicon source and the carrier gas, and may include at least one secondary elemental source, such as a germanium source and/or a carbon source. In some embodiments, the deposition gas may further include a dopant compound to provide a source of a dopant, such as boron, arsenic, phosphorus, gallium and/or aluminum.

In some embodiments, the silicon source may be usually provided into the process chamber at a rate in a range from about 5 sccm (standard cubic centimeters per minute) to about 500 sccm, from about 10 sccm to about 300 sccm, or from about 50 sccm to about 200 sccm. For example, the silicon source may be provided into the process chamber at a rate about 100 sccm.

In some embodiments, the silicon source may include silanes, halogenated silanes, and/or organosilanes.

In some embodiments, silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others.

In some embodiments, halogenated silanes may include compounds with the empirical formula $X'_ySi_xH_{(2x+2-y)}$, where X' is F, Cl, Br or I, such as hexachlorodisilane ($Si_2Cl_6$), tetrachlorosilane ($SiCl_4$), dichlorosilane ($Cl_2SiH_2$), and trichlorosilane ($Cl_3SiH$).

In some embodiments, organosilanes may include compounds with the empirical formula $R_ySi_xH_{(2x+2-y)}$, where R is methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), and hexamethyldisilane (($CH_3$)$_6Si_2$).

In some embodiments, organosilane compounds have been found to be advantageous silicon sources as well as carbon sources in embodiments which incorporate carbon in the layer of epitaxial material 611.

In the present embodiment, the silicon source may include silane, dichlorosilane, and disilane.

The silicon source is provided into the process chamber along with the carrier gas. In some embodiments, the carrier gas may have a flow rate from about 1 slm (standard liters per minute) to about 100 slm, from about 5 slm to about 75 slm, or from about 10 slm to about 50 slm. In the present embodiment, the flow rate of the carrier gas may be, for example, about 25 slm.

The carrier gas may be selected based on the precursor (e.g., the silicon source) used and/or the process temperature during the deposition process. Usually, the carrier gas is the same throughout the deposition process. However, some embodiments may use different carrier gases during the deposition process.

In some embodiments, the carrier gas may include nitrogen, hydrogen, argon, helium, or a combination thereof. In some embodiments, an inert carrier gas may be preferred and includes nitrogen, argon, helium, and a combination thereof.

Nitrogen may be utilized as the carrier gas in embodiments featuring low temperature (e.g., <800° C.) processes. Nitrogen remains inert during low temperature deposition processes. Therefore, nitrogen is not incorporated into the layer of epitaxial material 611 during low temperature deposition processes. Also, a nitrogen carrier gas does not form hydrogen-terminated surfaces as does a hydrogen carrier gas. The hydrogen-terminated surfaces formed by the adsorption of hydrogen carrier gas on the surface inhibit the growth rate of the layer of epitaxial material 611. Finally, the low temperature processes may take economic advantage of nitrogen as a carrier gas, since nitrogen is far less expensive than hydrogen, argon or helium.

In some embodiments, the deposition gas for depositing the layer of epitaxial material 611 may also include at least one secondary elemental source, such as a germanium source and/or a carbon source.

The germanium source may be added to the process chamber with the silicon source and carrier gas to form the layer of epitaxial material 611 including a silicon germanium material. The germanium source may be provided into the process chamber at a rate in the range from about 0.1 sccm to about 20 sccm, from about 0.5 sccm to about sccm, or from about 1 sccm to about 5 sccm. In some embodiments, the flow rate of the germanium source may be, for example, about 2 sccm.

In some embodiments, the germanium sources may include, for example, germane ($GeH_4$), higher germanes and organogermanes. In some embodiments, the higher germanes may include compounds with the empirical formula $Ge_xH_{(2x+2)}$, such as digermane ($Ge_2H_6$), trigermane ($Ge_3H_8$) and tetragermane ($Ge_4H_{10}$), as well as others.

In some embodiments, organogermanes may include compounds such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$).

Germanes and organogermane compounds have been found to be advantageous germanium sources and carbon sources in embodiments while incorporating germanium and carbon into the layer of epitaxial material 611. In some embodiments, the germanium concentration in the layer of epitaxial material 611 may be in the range from about 1 atomic % (at %) to about 30 at %, for example, about 20 at %. The germanium concentration may be graded within the layer of epitaxial material 611. For example, the germanium concentration may be graded with a higher germanium concentration in the lower portion of the layer of epitaxial material 611 than in the upper portion of the layer of epitaxial material 611.

Alternatively, the carbon source may be added to the process chamber with the silicon source and carrier gas to form the layer of epitaxial material 611 including a silicon carbon material.

In some embodiments, the carbon source may be provided into the process chamber at a rate in the range from about 0.1 sccm to about 20 sccm, from about 0.5 sccm to about 10 sccm, or from about 1 sccm to about 5 sccm. In some embodiments, the flow rate of the carbon source may be, for example, about 2 sccm.

In some embodiments, the carbon sources may include organosilanes, alkyls, alkenes and alkynes of ethyl, propyl and butyl. Such carbon sources include methylsilane ($CH_3SiH_3$), dimethylsilane (($CH_3)_2SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others.

In some embodiments, the carbon concentration of the layer of epitaxial material 611 may be in the range from about 1 at % to about at %, from about 1 at % to about 3 at %, for example 1.5 at %. In some embodiments, the carbon concentration may be graded within the layer of epitaxial material 611. For example, the carbon concentration may be graded with a higher carbon concentration in the lower portion of the layer of epitaxial material 611 than in the upper portion of the layer of epitaxial material 611.

Alternatively, a germanium source and a carbon source may both be added into the process chamber with the silicon source and carrier gas to form the layer of epitaxial material 611 including a silicon germanium carbon material.

In some embodiments, the deposition gas for depositing the layer of epitaxial material 611 may further include at least one dopant compound to provide a source of elemental dopant, such as boron, arsenic, phosphorus, gallium or aluminum. Dopants may provide the layer of epitaxial material 611 with various conductive characteristics, such as directional electron flow in a controlled and desired pathway required by the electronic device. The layer of epitaxial material 611 may be doped with particular dopants to achieve the desired conductive characteristic.

In one example, the layer of epitaxial material 611 may be doped p-type, such as by using diborane to add boron at a concentration in the range from about 1E15 atoms/cm^3 to about 1E21 atoms/cm^3. In one example, the p-type dopant may have a concentration of at least 5E19 atoms/cm^3. In another example, the p-type dopant may be in the range from about 1E20 atoms/cm^3 to about 2.5E21 atoms/cm^3. In another example, the layer of epitaxial material 611 may be doped n-type, such as with phosphorus and/or arsenic to a concentration in the range from about 1E15 atoms/cm^3 to about 1E21 atoms/cm^3.

In some embodiments, the dopant source may be provided into the process chamber at a rate in the range from about 0.1 sccm to about 20 sccm, from about 0.5 sccm to about 10 sccm, or from about 1 sccm to about 5 sccm. For example, the flow rate of the dopant source may be about 2 sccm. The boron-containing dopants may include boranes and organoboranes.

In some embodiments, boranes may include borane, diborane ($B_2H_6$), triborane, tetraborane and pentaborane, while alkylboranes may include compounds with the empirical formula $R_xBH_{(3-x)}$, where R is methyl, ethyl, propyl or butyl and x is 1, 2 or 3.

Alkylboranes may include trimethylborane (($CH_3)_3B$), dimethylborane (($CH_3)_2BH$), triethylborane (($CH_3CH_2)_3B$) and diethylborane (($CH_3CH_2)_2BH$).

In some embodiments, the dopants may also include arsine ($AsH_3$), phosphine ($PH_3$) and alkylphosphines, such as with the empirical formula $R_xPH_{(3-x)}$, where R is methyl, ethyl, propyl or butyl and x is 1, 2 or 3.

In some embodiments, alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$).

In some embodiments, aluminum and gallium dopant sources may include alkylated and/or halogenated derivatives, such as described with the empirical formula $R_xMX_{(3-x)}$, where M is Al or Ga, R is methyl, ethyl, propyl or butyl, X is Cl or F and x is 0, 1, 2 or 3. Examples of aluminum and gallium dopant sources may include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$) and gallium chloride ($GaCl_3$).

After the layer of epitaxial material 611 is formed, the process chamber may be flushed with a purge gas or the carrier gas and/or the process chamber may be evacuated with a vacuum pump. The purging and/or evacuating processes remove excess deposition gas, reaction by-products and other contaminants.

With reference to FIG. 3, the well region 115 may be formed in the active region of the substrate 111. The well region 115 may be formed by an implantation process. The implantation process may add p-type impurities (dopants) or n-type impurities (dopants) to the substrate 111 to form the well region 115 having an electrical type. The implantation process including p-type impurities may add impurities to an intrinsic semiconductor that creates deficiencies of valence electrons. In a silicon-containing substrate, examples of p-type dopants, i.e., impurities include but are not limited to boron, aluminum, gallium, or indium. The implantation process including n-type impurities may contribute free electrons to the intrinsic semiconductor. In a silicon-containing substrate, examples of n-type dopants, i.e., impurities, include but are not limited to antimony, arsenic, and phosphorous. It should be noted that the term "electrical type" denotes a dopant region being p-type or n-type.

In the present embodiment, the well region 115 may be formed by the implantation process including p-type impurities and may have a first electrical type (e.g., the p-type.)

Figure 4:
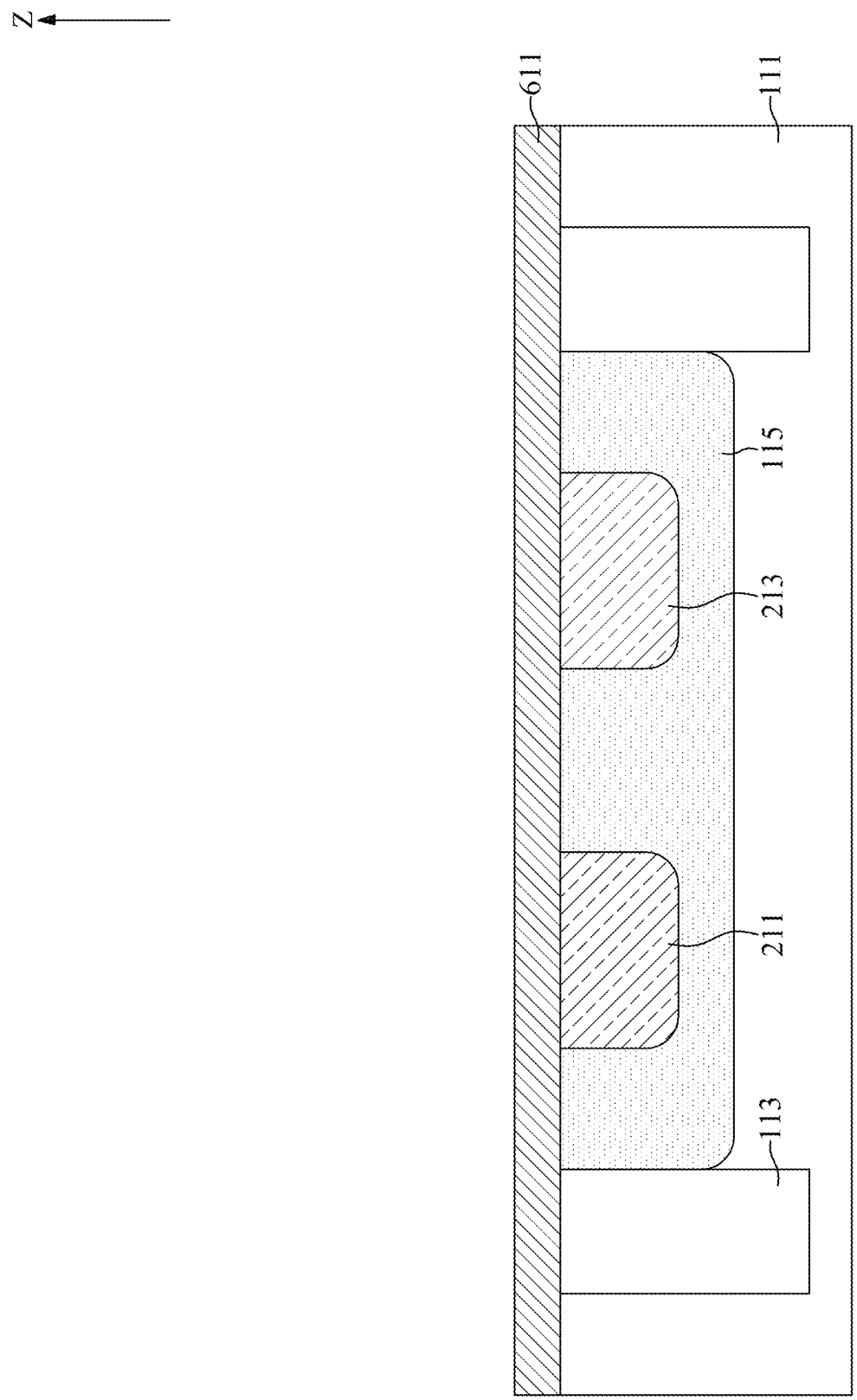
Figure 5:
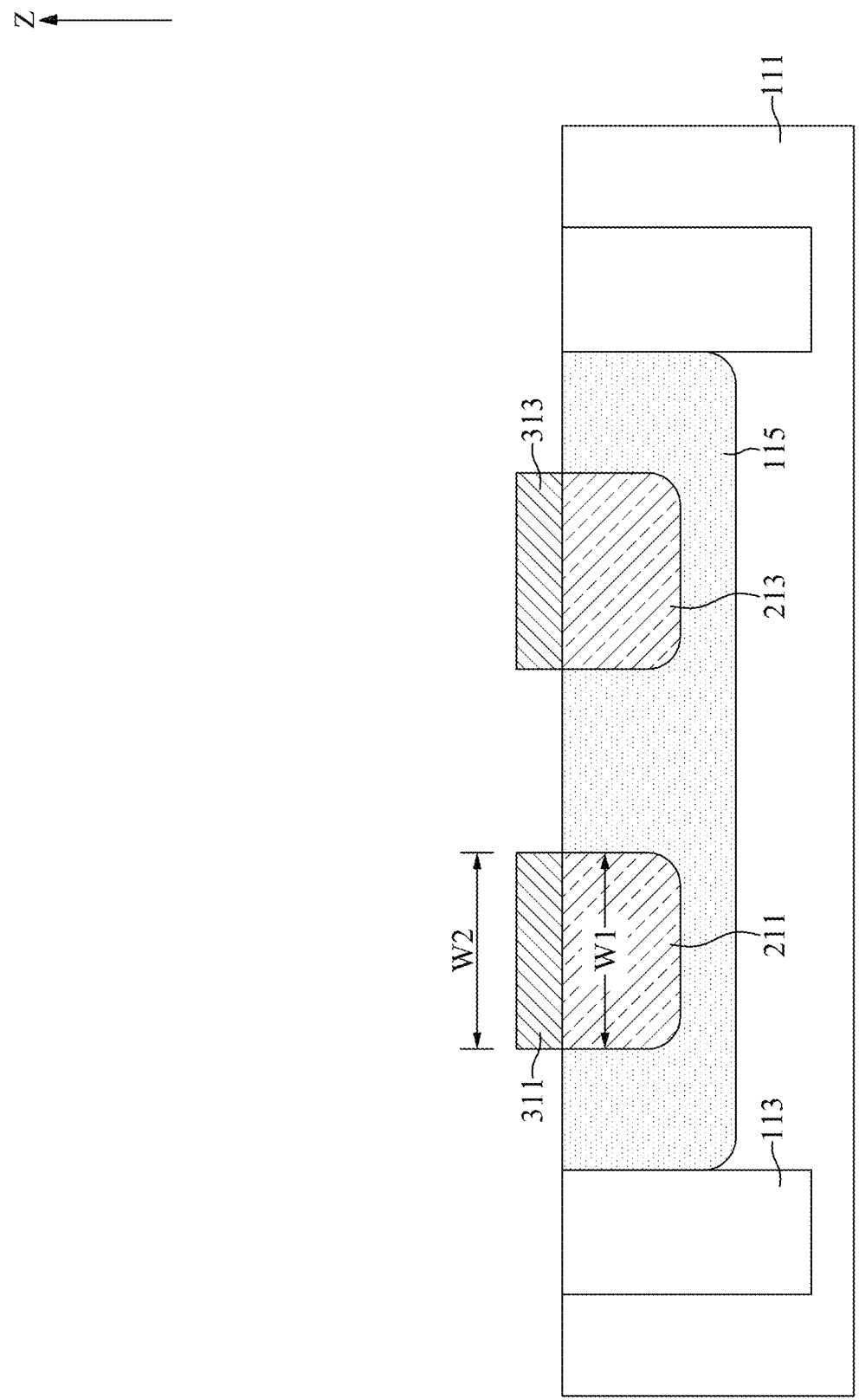

With reference to FIGS. 1, 4, and 5, at step S13, a plurality of impurity regions 211, 213 may be formed in the well region 115, a portion of the layer of epitaxial material 611 may be removed to form a plurality of bottom assistant layers 311, 313.

With reference to FIG. 4, the plurality of impurity regions 211, 213 (the left impurity region may be referred to as the first impurity region 211 and the right impurity region may be referred to as the second impurity region 213) may be formed by an implantation process with a mask layer (not shown in FIG. 4) defining the position of the plurality of impurity regions 211, 213. The implantation process may be performed with p-type impurities and/or n-type impurities using the mask layer as a mask. In the present embodiment, the plurality of impurity regions 211, 213 are formed by the implantation process including p-type impurities such as boron, aluminum, gallium, or indium. In some embodiments, the dopant concentration of the plurality of impurity regions 211, 213 may be greater than the dopant concentration of the well region 115. In some embodiments, the dopant concentration of the plurality of impurity regions 211, 213 may be between about 1E19 atoms/cm^3 and about 1E21 atoms/cm^3.

In some embodiments, the first impurity region 211 and the second impurity region 213 may have the same electrical type (e.g., the n-type.) In some embodiments, the first impurity region 211 and the second impurity region 213 may have different electrical types.

With reference to FIG. 5, a first etching process may be performed with a mask layer (not shown in FIG. 5) to remove portions of the layer of epitaxial material 611 to form the plurality of bottom assistant layers 311, 313. The mask layer may include the pattern of the plurality of bottom assistant layers 311, 313. During the first etching process, the layer of epitaxial material 611 may be exposed to the etching gas for a period of time in the range from about 10 seconds to about 90 seconds, from about 20 seconds to about 60 seconds, or from about 30 seconds to about 45 seconds.

In some embodiments, the etching gas may include at least one etchant and a carrier gas. The etchant may be provided into the process chamber at a rate in the range from about 10 sccm to about 700 sccm, from about 50 sccm to about 500 sccm, or from about 100 sccm to about 400 sccm. For example, the flow rate of the etchant may be at about 200 sccm.

The etchant used in the etching gas may include chlorine ($Cl_2$), hydrogen chloride (HCl), boron trichloride ($BCl_3$), carbon tetrachloride ($CCl_4$), chlorotrifluoride ($ClF_3$) and combinations thereof. Preferably, chlorine or hydrogen chloride is used as the etchant.

The etchant is usually provided into the process chamber with the carrier gas. The carrier gas may have a flow rate in the range from about 1 slm to about 100 slm, from about 5 slm to about 75 slm, or from about 10 slm to about 50 slm. For example, the flow rate of the carrier gas may be about 25 slm. In some embodiments, the carrier gas may include nitrogen, hydrogen, argon, helium, or a combination thereof.

In some embodiments, an inert carrier gas is preferred and includes nitrogen, argon, helium and combinations thereof. The carrier gas may be selected based upon specific precursor(s) and/or temperature used during the deposition of the layer of epitaxial material 611. The same carrier gas may be usually used during the deposition of the layer of epitaxial material 611 and the first etching process. However, in some embodiments, different carrier gases may be applied during the deposition of the layer of epitaxial material 611 and the first etching process.

In some embodiments, the preferred etchant may be chlorine gas, especially when the deposition process of the layer of epitaxial material 611 is conducted at a low temperature (e.g., <800° C.). For example, the first etching process using an etching gas containing chlorine as the etchant and nitrogen as the carrier gas may be performed at a temperature in a range from about 500° C. to about 750° C. In another example, the first etching process using an etching gas containing chlorine and nitrogen may be performed at a temperature in a range from about 250° C. to about 500° C.

After the plurality of bottom assistant layers 311, 313 are formed, the process chamber may be flushed with a purge gas or the carrier gas and/or the process chamber may be evacuated with a vacuum pump. The purging and/or evacuating processes remove excess etching gas, reaction by-products and other contaminants. The mask layer may be removed after the purging and/or evacuating processes.

With reference to FIG. 5, the widths W2 of the plurality of bottom assistant layers 311, 313 and the widths W1 of the plurality of impurity regions 211, 213 may be substantially the same. In some embodiments, the widths W2 of the plurality of bottom assistant layers 311, 313 and the widths W1 of the plurality of impurity regions 211, 213 may be different. For example, the widths W2 of the plurality of bottom assistant layers 311, 313 may be greater than the widths W1 of the plurality of impurity regions 211, 213.

With reference to FIG. 1 and FIGS. 6 to 10, at step S15, a first dielectric layer 121 may be formed on the substrate 111, and a plurality of contacts 411, 413 may be formed on the plurality of bottom assistant layers 311, 313.

Figure 6:
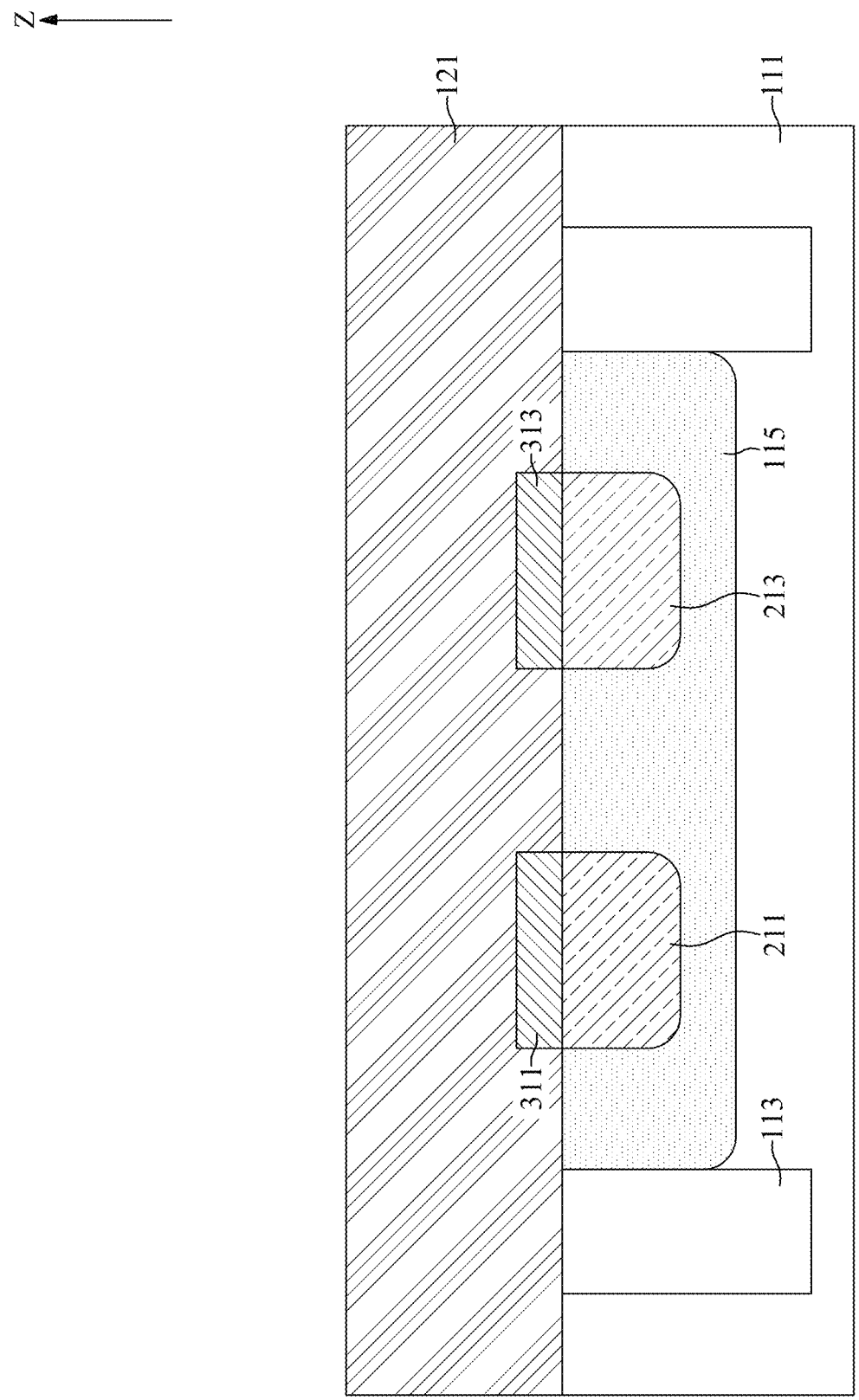

With reference to FIG. 6, the first dielectric layer 121 may be formed on the substrate 111 to cover the plurality of bottom assistant layers 311, 313. In some embodiments, the first dielectric layer 121 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the first dielectric layer 121 may be formed by a deposition process such as chemical vapor deposition, plasma enhanced chemical vapor deposition, or other applicable deposition process.

In some embodiments, the first dielectric layer 121 may include, for example, silicon dioxide, undoped silicate glass, fluorosilicate glass, borophosphosilicate glass, a spin-on low-k dielectric layer, a chemical vapor deposition low-k dielectric layer, or a combination thereof. The term "low-k" as used throughout the present application denotes a dielectric material that has a dielectric constant of less than silicon dioxide. In some embodiments, the first dielectric layer 121 may include a self-planarizing material such as a spin-on glass or a spin-on low-k dielectric material such as SiLK™ The use of a self-planarizing dielectric material may avoid the need to perform a subsequent planarizing step. In some embodiments, the first dielectric layer 121 may be formed by a deposition process including, for example, chemical vapor deposition, plasma enhanced chemical vapor deposition, spin-on coating, or other applicable deposition process.

In some embodiments, a planarization process, such as chemical mechanical polishing, may be performed to remove excess material and provide a substantially flat surface for subsequent processing steps.

Figure 7:
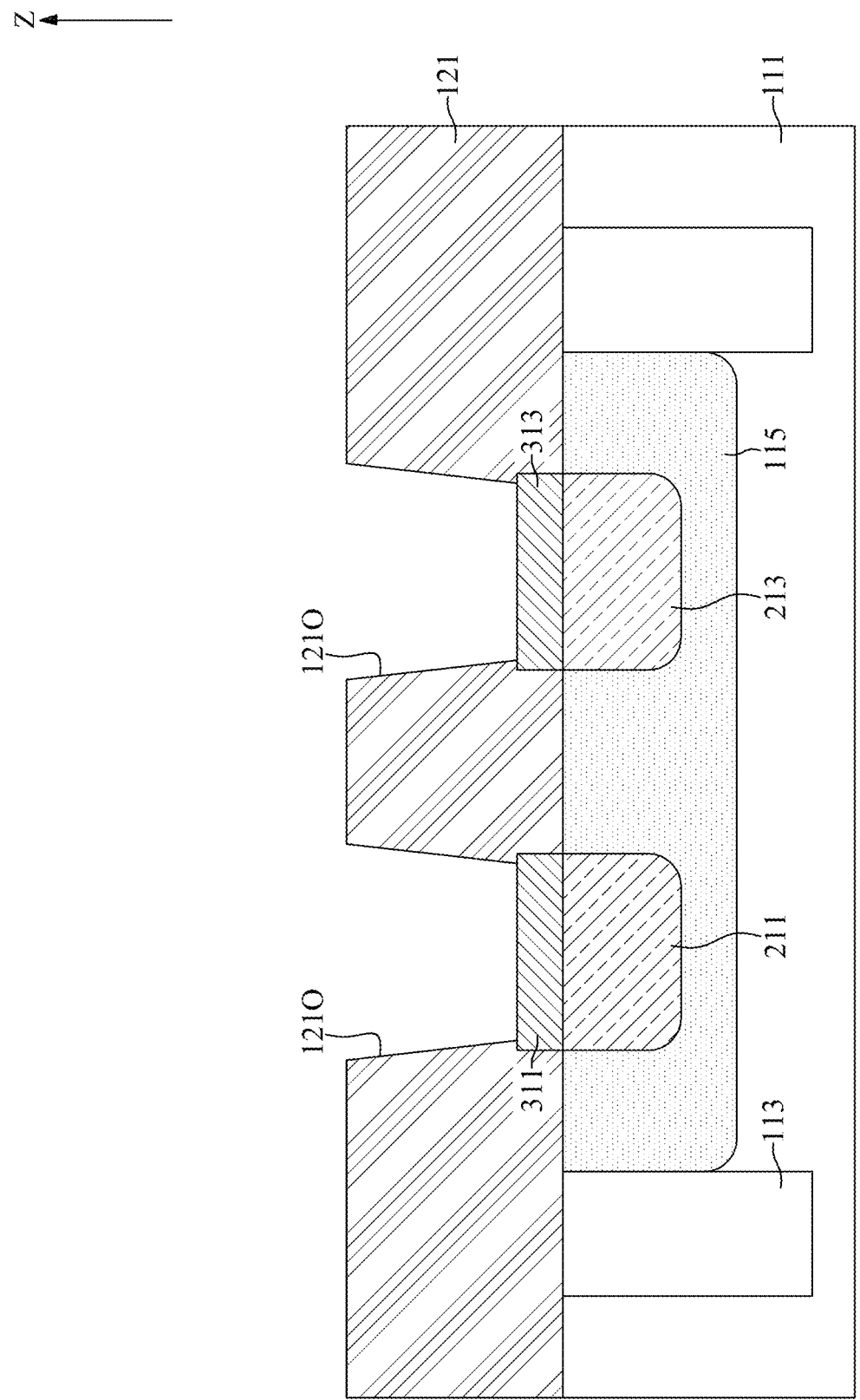

With reference to FIG. 7, a plurality of contact openings 1210 may be formed to expose the plurality of bottom assistant layers 311, 313. The plurality of contact openings 1210 may be formed by an opening etching process with a mask layer (not shown in FIG. 7). The mask layer may include the pattern of the plurality of contact openings 1210. In some embodiments, the etch rate ratio of the first dielectric layer 121 to the plurality of bottom assistant layers 311, 313 may be between about 100:1 and about 1.05:1, between about 15:1 and about 2:1, or between about 10:1 and about 2:1 during the opening etching process. In some embodiments, the sidewalls of the plurality of contact openings 1210 may be tapered.

Figure 8:
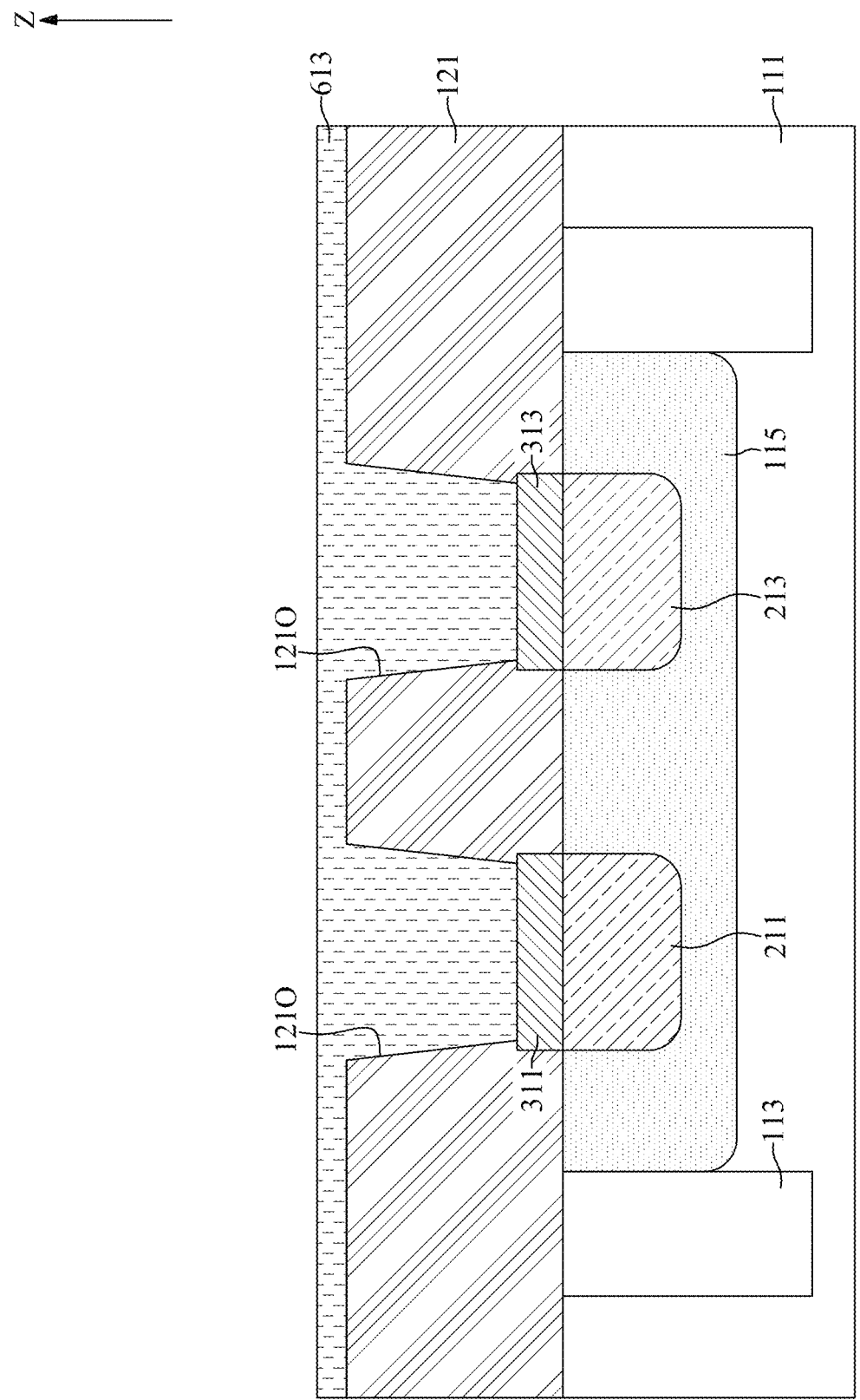

With reference to FIG. 8, a layer of first conductive material 613 may be formed to completely fill the plurality of contact openings 1210. In some embodiments, the first conductive material 613 may be, for example, doped polycrystalline silicon, doped polycrystalline germanium, doped polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the first conductive material 613 may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the first conductive material 613 may consist essentially of silicon, germanium, or silicon germanium.

In some embodiments, the layer of first conductive material 613 may be formed by, for example, chemical vapor deposition, physical vapor deposition, sputtering, the like, or other applicable deposition process.

Figure 9:
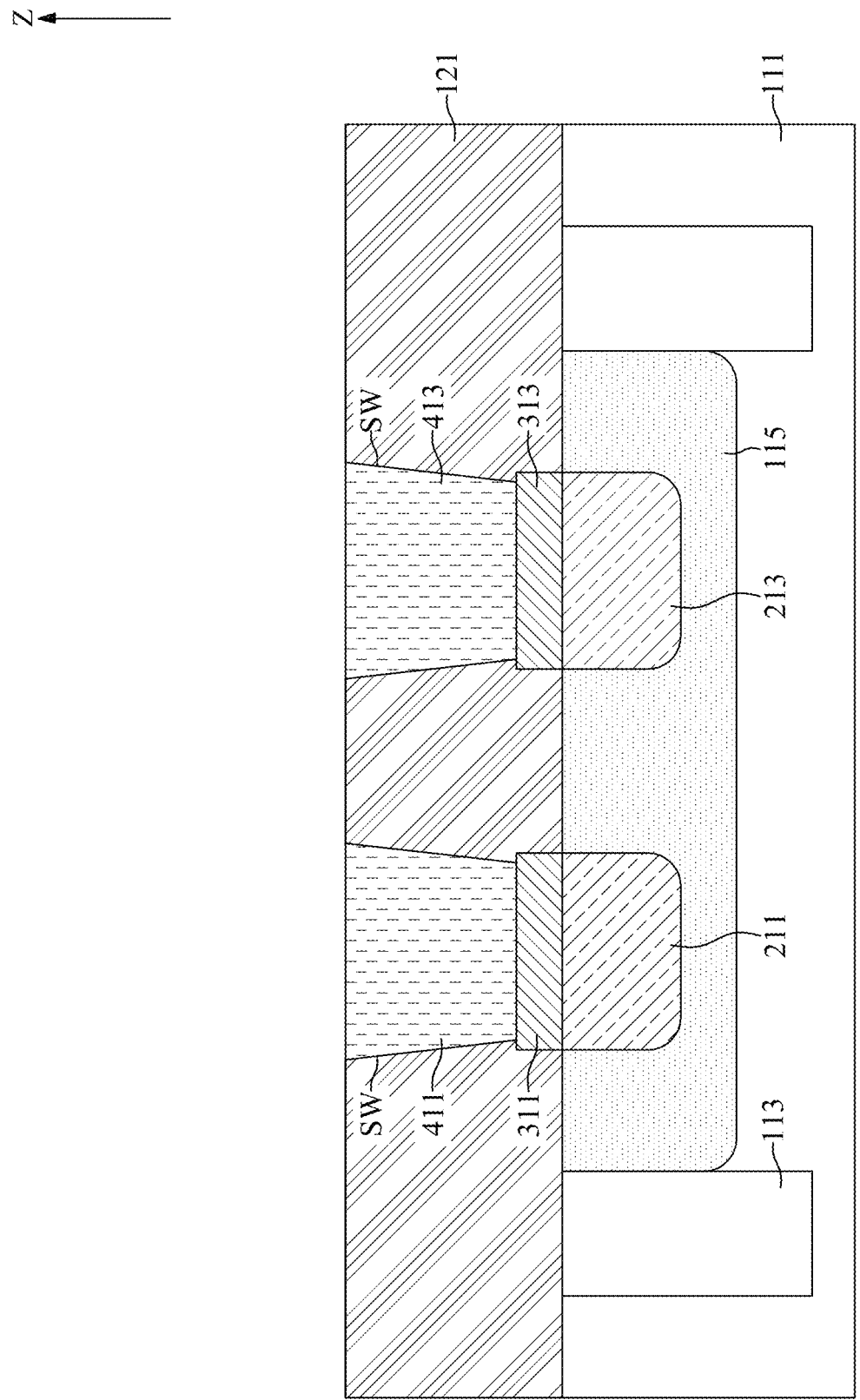

With reference to FIG. 9, a planarization process, such as chemical mechanical polishing, may be performed until the top surface of the first dielectric layer 121 is exposed to remove excess material, provide a substantially flat surface for subsequent processing steps, and concurrently turn the layer of first conductive material 613 into the plurality of contacts 411, 413. The left contact may be referred to as the first contact 411. The first contact 411 may be formed on the first bottom assistant layer 311. The right contact may be referred to as the second contact 413. The second contact 413 may be formed on the second bottom assistant layer 313. In some embodiments, the sidewalls SW of the plurality of contacts 411, 413 may be tapered. In some embodiments, the sidewalls SW of the plurality of contacts 411, 413 may be substantially vertical (not shown).

Figure 10:
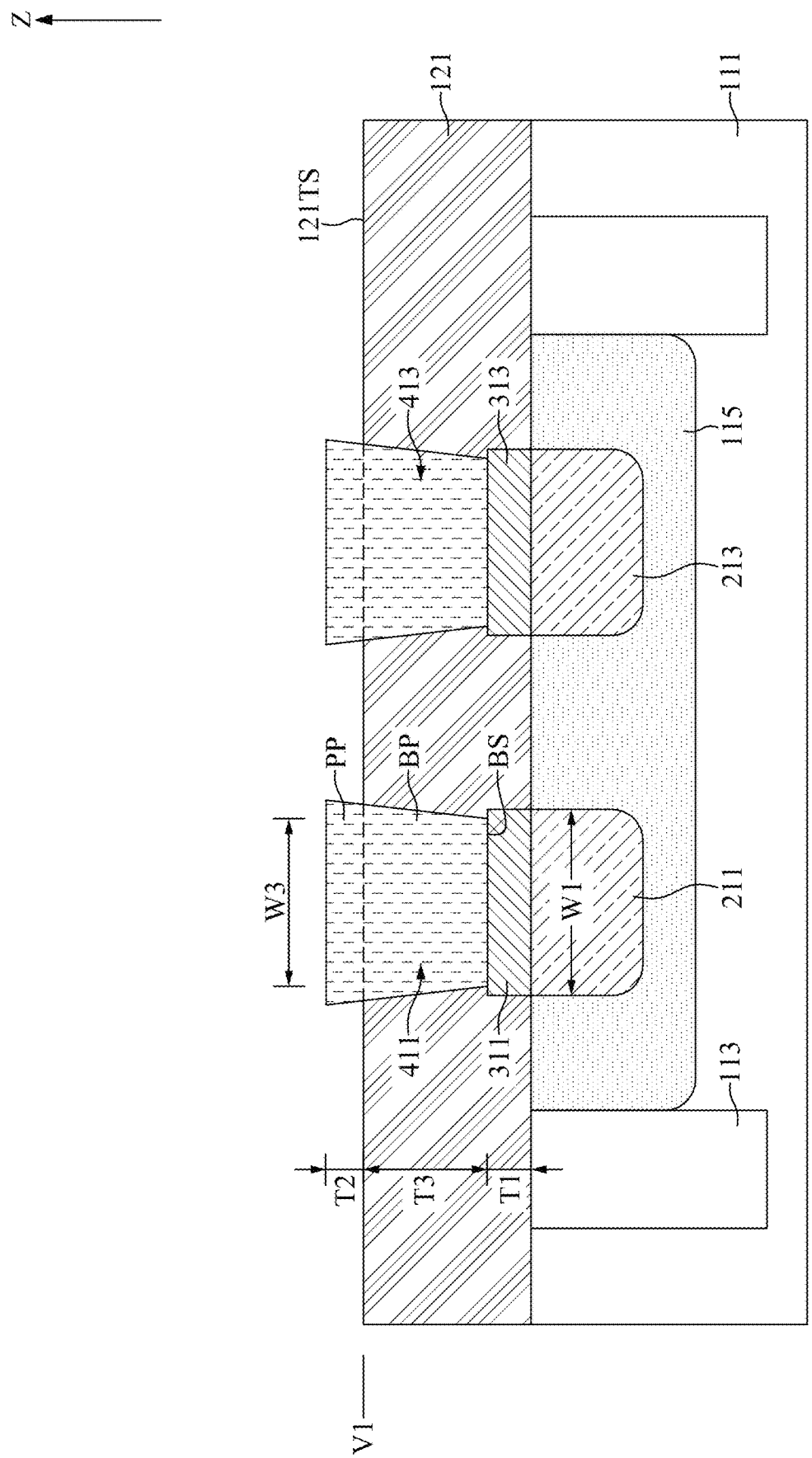

With reference to FIG. 10, a recessing process may be performed to recess the top surface 121TS of the first dielectric layer 121 to a vertical level V1. The vertical level V1 may be lower than the top surfaces of the plurality of contacts 411, 413. In some embodiments, the etch rate ratio of the first dielectric layer 121 to the plurality of contacts 411, 413 may be between about 100:1 and about 1.05:1, between about 15:1 and about 2:1, or between about 10:1 and about 2:1 during the recessing process. After the recessing process, portions of the plurality of contacts 411, 413 may be protruding from the top surface 121TS of the first dielectric layer 121. The portions of the plurality of contacts 411, 413 protruding from the top surface 121TS of the first dielectric layer 121 may be referred to as a plurality of protruding portions PP of the plurality of contacts 411, 413. Accordingly, portions of the plurality of contacts 411, 413 may be still surrounded by the first dielectric layer 121. The portions of the plurality of contacts 411, 413 surrounded by the first dielectric layer 121 may be referred to as a plurality of buried portions BP of the plurality of contacts 411, 413.

For brevity, clarity, and convenience of description, only the protruding portion PP and the buried portion BP of the first contact 411 are described.

With reference to FIG. 10, in some embodiments, the thickness T2 of the protruding portion PP and the thickness T1 of the first bottom assistant layer 311 may be different. For example, the thickness T2 of the protruding portion PP may be greater than the T1 of the first bottom assistant layer 311. In some embodiments, the thickness T2 of the protruding portion PP and the thickness T1 of the first bottom assistant layer 311 may be substantially the same.

In some embodiments, a thickness ratio of the thickness T3 of the buried portion BP to the thickness T2 of the protruding portion PP may be between about 30 and about 5, or between about 20 and about 5.

In some embodiments, the width W3 of the bottom surface BS of the first contact 411 may be less than the width W2 of the first bottom assistant layer 311. In some embodiments, the width W3 of the bottom surface BS of the first contact 411 and the width W2 of the first bottom assistant layer 311 may be substantially the same.

It should be noted that, in the description of the present disclosure, the term "selectively depositing a layer on a first feature over a second feature", and the like, means that a first amount of the layer is deposited on the first feature and a second amount of the layer is deposited on the second feature, where the first amount of the layer is greater than the second amount of the layer, or no layer is deposited on the second feature. The selectivity of a deposition process may be expressed as a multiple of growth rate. For example, if one surface is deposited on twenty-five times faster than a different surface, the process would be described as having a selectivity of 25:1 or simply 25. In this regard, higher ratios indicate more selective deposition processes.

The term "over" used in this regard does not imply a physical orientation of one feature on top of another feature, rather a relationship of the thermodynamic or kinetic properties of the chemical reaction with one feature relative to the other feature. For example, selectively depositing a cobalt layer onto a metal surface over a dielectric surface means that the cobalt layer deposits on the metal surface and less or no cobalt layer deposits on the dielectric surface; or that the formation of a cobalt layer on the metal surface is thermodynamically or kinetically favorable relative to the formation of a cobalt layer on the dielectric surface.

Figure 11:
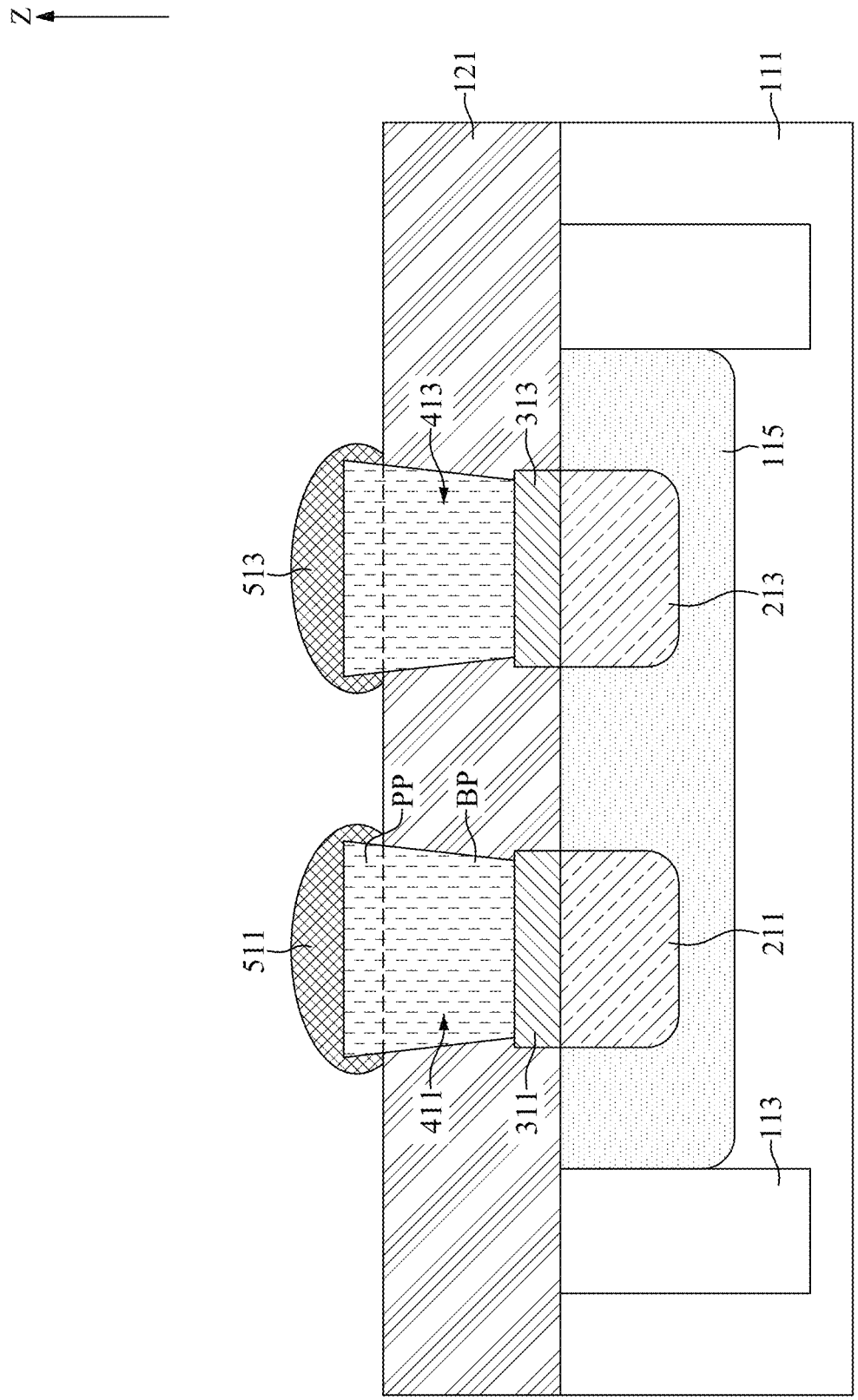

With reference to FIGS. 1 and 11, at step S17, a plurality of top assistant caps 511, 513 may be formed on the plurality of contacts 411, 413.

With reference to FIG. 11, the plurality of top assistant caps 511, 513 may be selectively deposited on the plurality of protruding portions PP of the plurality of contacts 411, 413 over the first dielectric layer 121. The plurality of protruding portions PP may be completely covered by the plurality of top assistant caps 511, 513. In some embodiments, the plurality of top assistant caps 511, 513 may be formed of, for example, germanium. In some embodiments, the plurality of top assistant caps 511, 513 may include an atomic percentage of germanium greater than or equal to 50%. In this regard, the plurality of top assistant caps 511, 513 may be described as "germanium-rich layers". In some embodiments, the atomic percentage of germanium in the plurality of top assistant caps 511, 513 may be greater than or equal to 60%, greater than or equal to 70%, greater than or equal to 80%, greater than or equal to 90%, greater than or equal to 95%, greater than or equal to 98%, greater than or equal to 99%, or greater than or equal to 99.5%. Stated differently, in some embodiments, the plurality of top assistant caps 511, 513 may consist essentially of germanium. In some embodiments, the plurality of top assistant caps 511, 513 may include silicon and germanium. Stated differently, in some embodiments, the plurality of top assistant caps 511, 513 may include silicon germanium.

In some embodiments, the plurality of top assistant caps 511, 513 may be formed by a deposition process. In some embodiments, the deposition process may include a reactive gas including a germanium precursor and/or hydrogen gas. In some embodiments, the germanium precursor may consist essentially of germane. In some embodiments, the germanium precursor may include one or more of germane, digermane, isobutylgermane, chlorogermane, or dichlorogermane. In some embodiments, the hydrogen gas may be used as a carrier or diluent for the germanium precursor. In some embodiments, the reactive gas may consist essentially of germane and hydrogen gas. In some embodiments, the molar percentage of germane in the reactive gas may be in a range of about 1% to about 50%, in a range of about 2% to about 30%, or in a range of about 5% to about 20%.

Alternatively, in some embodiments, the reactive gas may further include a silicon-containing precursor. In some embodiments, the silicon-containing precursor may include one or more of silane, a polysilane, or a halosilane. As used in this regard, a "polysilane" is a species with the general formula $Si_nH_{2n+2}$ where n is 2 to 6. Further, a "halosilane" is a species with the general formula $Si_aX_bH_{2a+2-b}$ where X is a halogen, a is 1 to 6, and b is 1 to 2a+2. In some embodiments, the silicon-containing precursor may include one or more of $SiH_4$, $Si_2H_6$, $Si_3H_8$, $Si_4H_{10}$, $SiCl_4$, or $SiH_2Cl_2$.

In some embodiments, the temperature of the intermediate semiconductor device illustrated in FIG. 10 to be deposited the plurality of top assistant caps 511, 513 may be maintained during the deposition process. The temperature may be referred to as the substrate temperature. In some embodiments, the substrate temperature may be in a range between about 300° C. and about 800° C., between about 400° C. and about 800° C., between about 500° C. and about 800° C., between about 250° C. and about 600° C., between about 400° C. and about 600° C., or between about 500° C. and about 600° C. In some embodiments, the substrate temperature may be about 540° C.

In some embodiments, the pressure of the processing chamber for depositing the plurality of top assistant caps 511, 513 may be maintained during the deposition process. In some embodiments, the pressure is maintained in a range between about 1 Torr and about 300 Torr, between about 10 Torr and about 300 Torr, between about 50 Torr and about 300 Torr, between about 100 Torr and 300 Torr, between about 200 Torr and about 300 Torr, or between about 1 Torr and about 20 Torr. In some embodiments, the pressure may be maintained at about 13 Torr.

In some embodiments, the selectivity of the deposition may be greater than or equal to 5, greater than or equal to 10, greater than or equal to 20, greater than or equal to 30, or greater than or equal to 50. In some embodiments, the plurality of top assistant caps 511, 513 may be deposited on the plurality of contacts 411, 413 to a thickness before deposition is observed on the first dielectric layer 121.

With reference to FIG. 1 and FIGS. 12 to 14, at step S19, a second dielectric layer 123 may be formed on the first dielectric layer 121, and a first top conductive layer 125 may be formed on the plurality of top assistant caps 511, 513.

Figure 12:
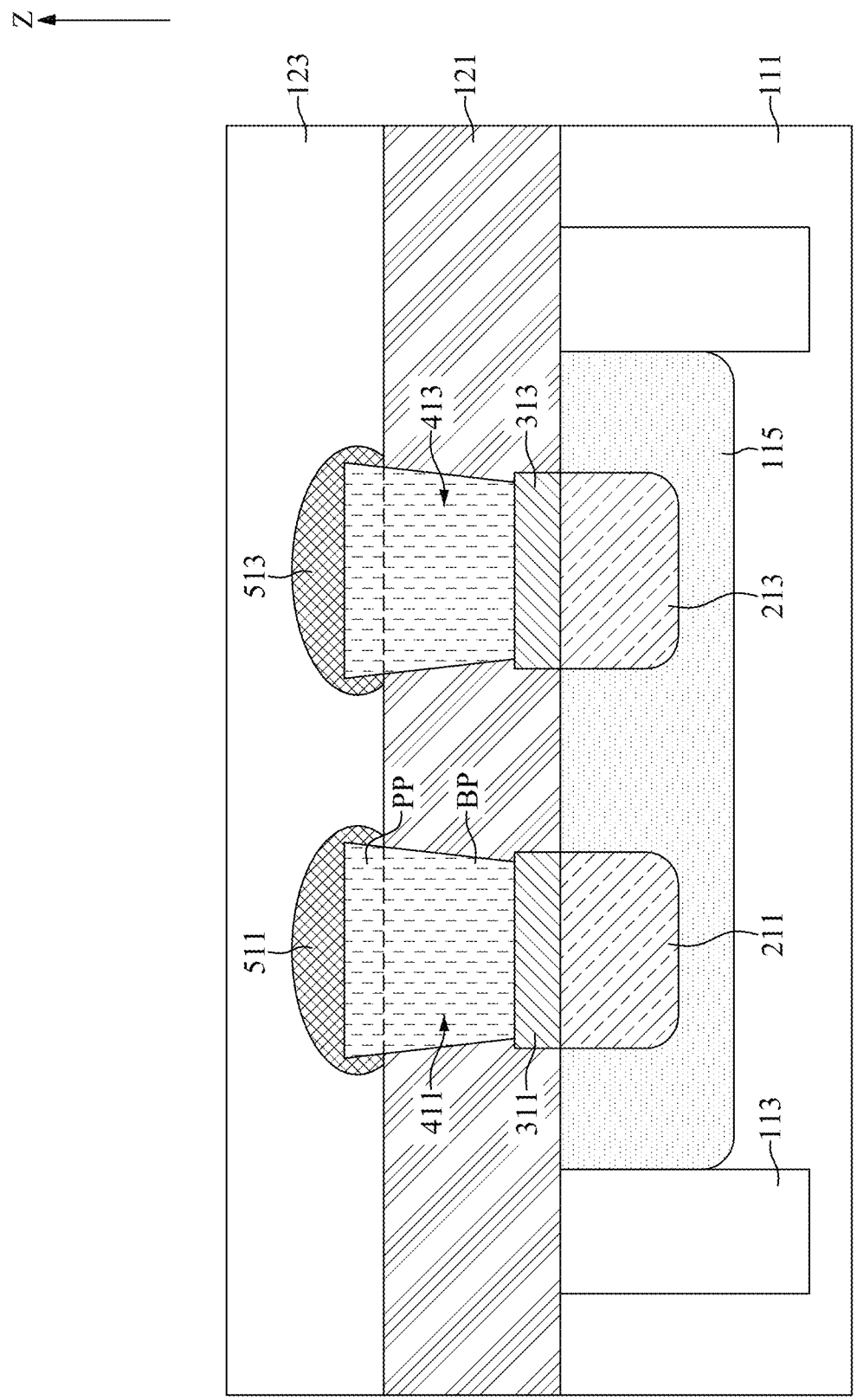

With reference to FIG. 12, the second dielectric layer 123 may be formed on the first dielectric layer 121 to cover the plurality of top assistant caps 511, 513. In some embodiments, the second dielectric layer 123 may be formed of, for example, silicon oxide, borophosphosilicate glass, undoped silicate glass, fluorinated silicate glass, the like, or a combination thereof. In some embodiments, the undoped silicate glass can be expressed as formula $SiO_x$. The x may be between 1.4 and 2.1. In some embodiments, the second dielectric layer 123 may be formed by a deposition process such as chemical vapor deposition, plasma enhanced chemical vapor deposition, or other applicable deposition process.

In some embodiments, the second dielectric layer 123 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the second dielectric layer 123 may include a self-planarizing material such as a spin-on glass or a spin-on low-k dielectric material such as SiLK™. The use of a self-planarizing dielectric material may avoid the need to perform a subsequent planarizing step. In some embodiments, the second dielectric layer 123 may be formed by a deposition process including, for example, chemical vapor deposition, plasma enhanced chemical vapor deposition, spin-on coating, or other applicable deposition process.

In some embodiments, a planarization process, such as chemical mechanical polishing, may be performed to remove excess material and provide a substantially flat surface for subsequent processing steps.

Figure 13:
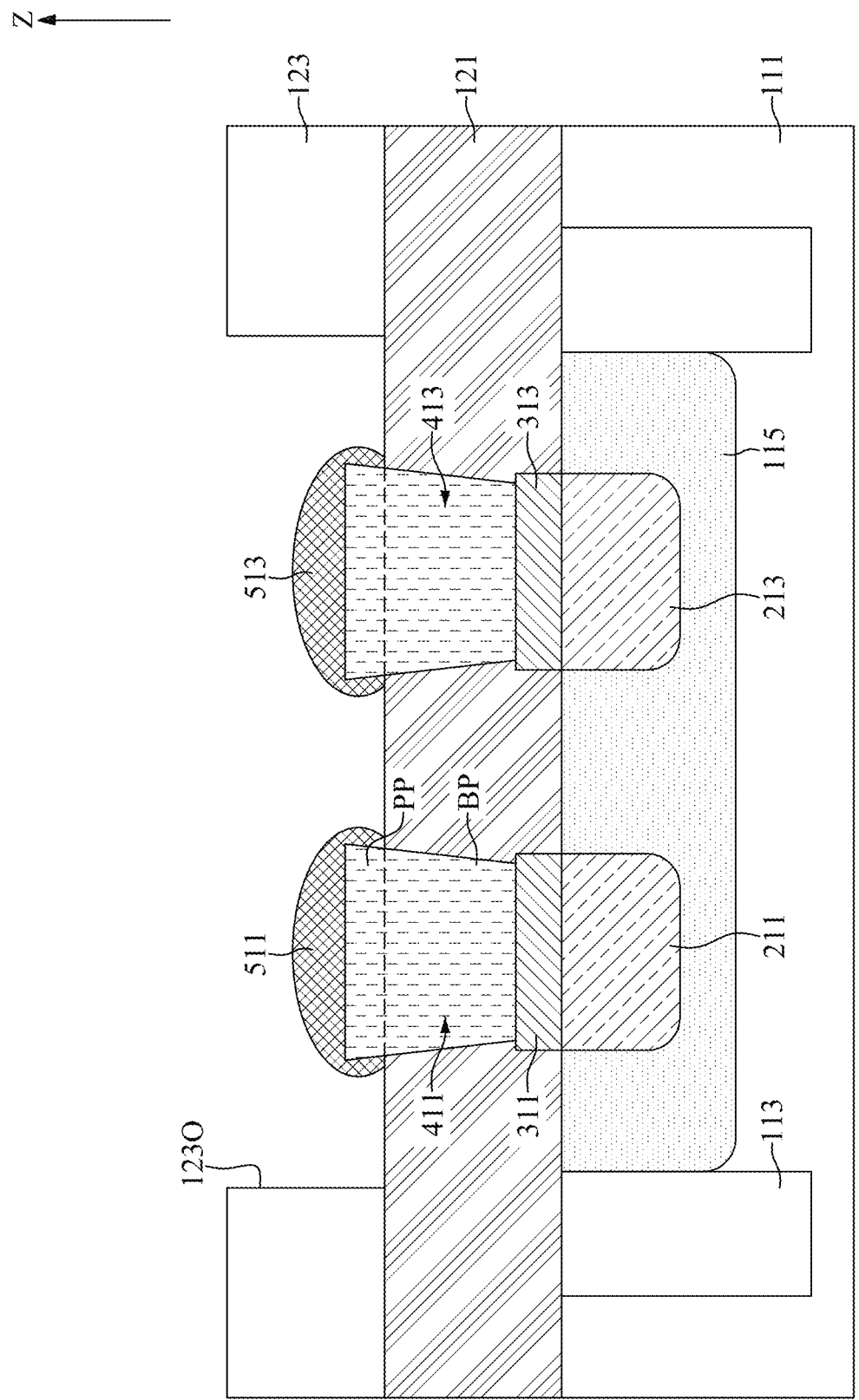

With reference to FIG. 13, an opening 1230 may be formed along the second dielectric layer 123 to expose the plurality of top assistant caps 511, 513. The opening 1230 may be formed by an etching process with a mask layer (not shown) including the pattern of the opening 1230. In some embodiments, the etch rate ratio of the first dielectric layer 121 to the plurality of top assistant caps 511, 513 may be between about 100:1 and about 1.05:1, between about 15:1 and about 2:1, or between about 10:1 and about 2:1 during the etching process.

Figure 14:
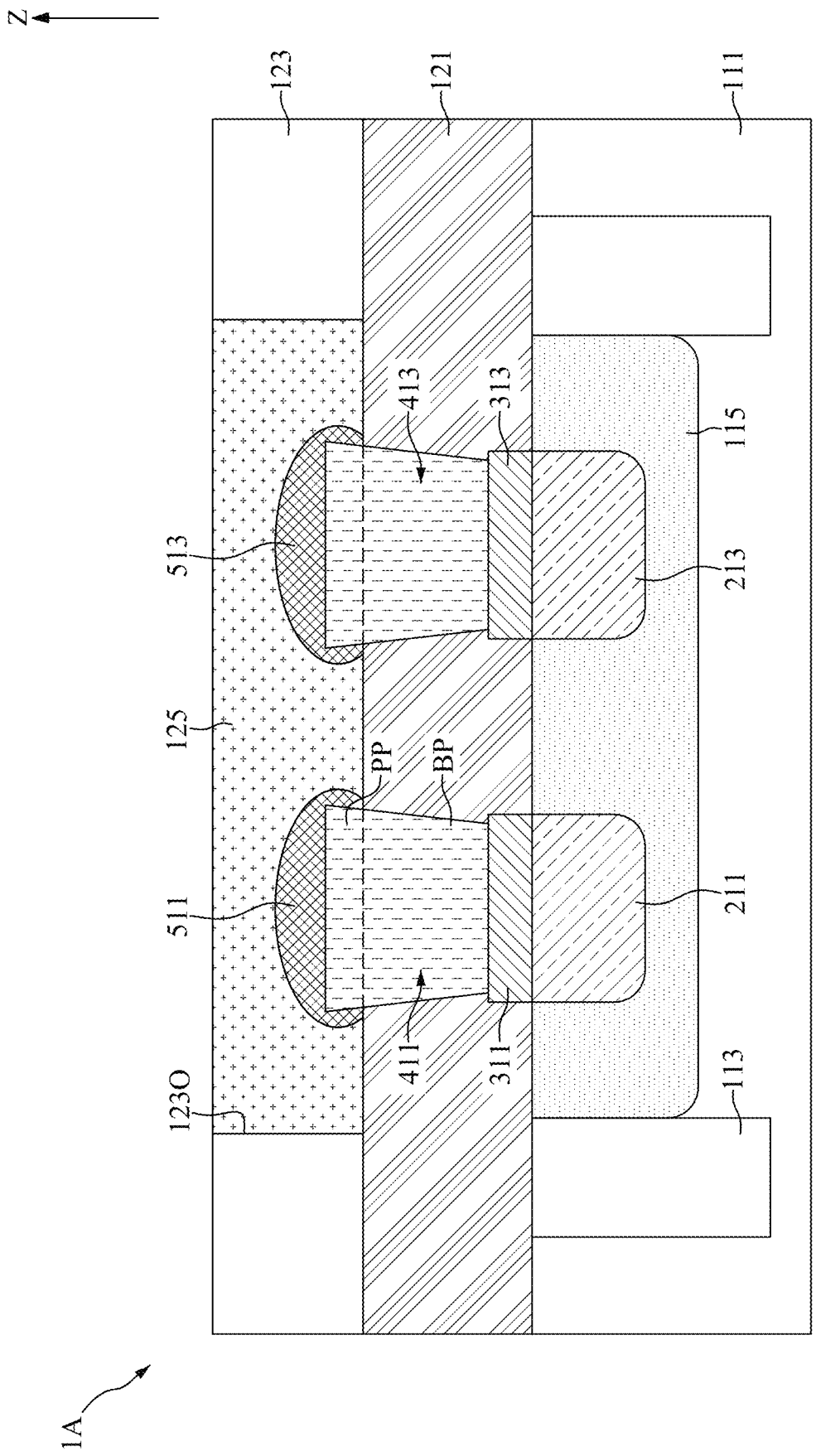

With reference to FIG. 14, a conductive material may be deposited into the opening 1230 by a deposition process. After the deposition process, a planarization process, such as chemical mechanical polishing, may be performed to remove excess material, provide a substantially flat surface for subsequent processing steps, and conformally form the first top conductive layer 125. The conductive material may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The deposition process may be, for example, physical vapor deposition, chemical vapor deposition, sputtering, electroplating, or other applicable deposition processes. In the present embodiment, the plurality of contacts 411, 413 may be electrically connected by the first top conductive layer 125.

By employing the plurality of top assistant caps 511, 513, the resistance between the first top conductive layer 125 and the plurality of contacts 411, 413 may be reduced. As a result, the performance of the semiconductor device 1A may be improved.

Figure 15:
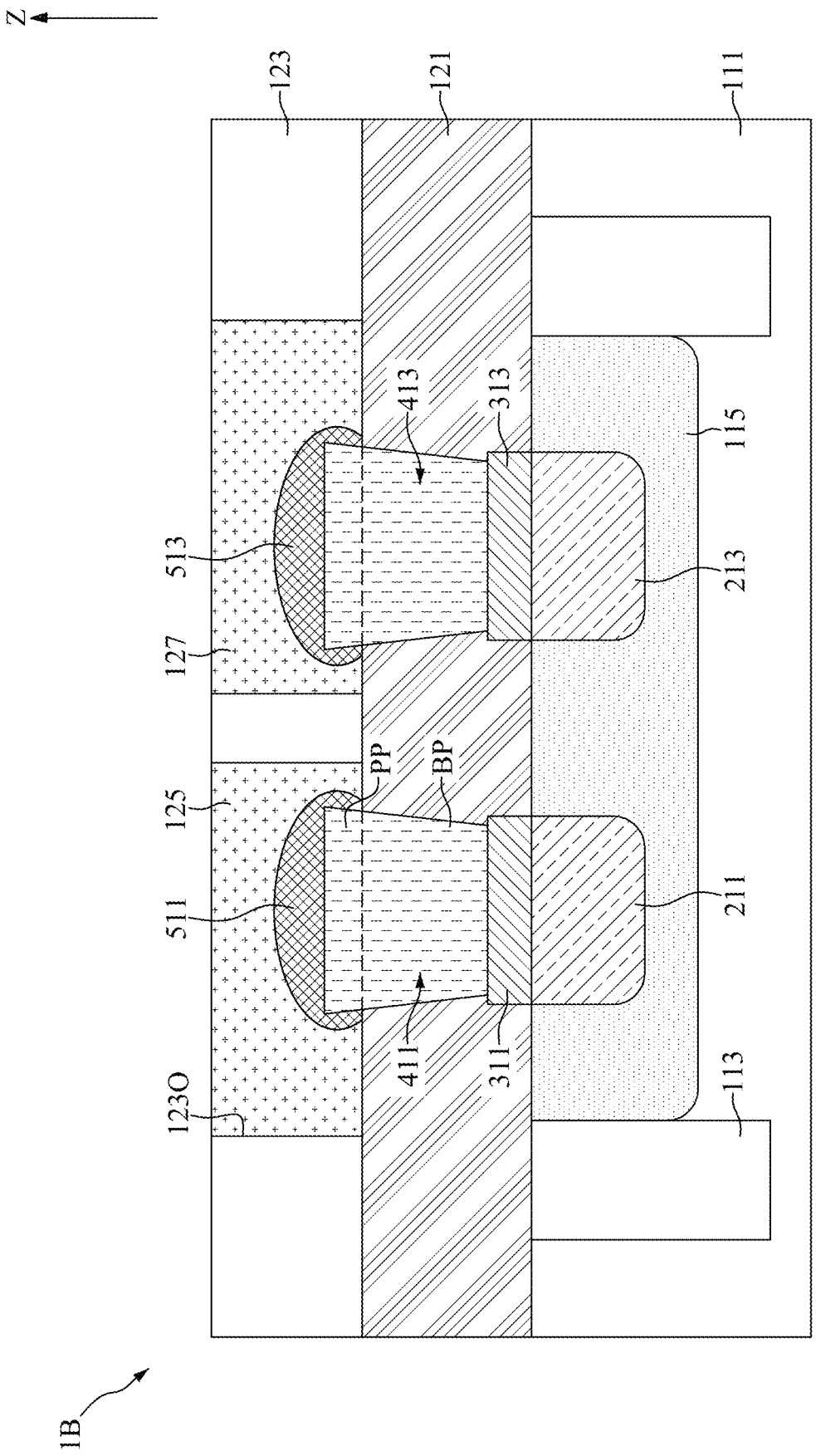
FIG. 15 illustrates, in a schematic cross-sectional view diagram, a semiconductor device in accordance with another embodiment of the present disclosure.

FIG. 15 illustrates, in a schematic cross-sectional view diagram, a semiconductor device 1B in accordance with another embodiment of the present disclosure.

With reference to FIG. 15, the semiconductor device 1B may have a structure similar to that illustrated in FIG. 14. The same or similar elements in FIG. 15 as in FIG. 14 have been marked with similar reference numbers and duplicative descriptions have been omitted.

With reference to FIG. 15, the semiconductor device 1B may include a plurality of top conductive layers 125, 127. The left top conductive layer may be referred to as the first top conductive layer 125. The right top conductive layer may be referred to as the second top conductive layer 127. The first top conductive layer 125 may be disposed on the first top assistant cap 511 and along the second dielectric layer 123. The second top conductive layer 127 may be disposed on the second top assistant cap 513 and along the second dielectric layer 123. In some embodiments, the first top conductive layer 125 and the second top conductive layer 127 may be electrically isolated.

Figure 16:
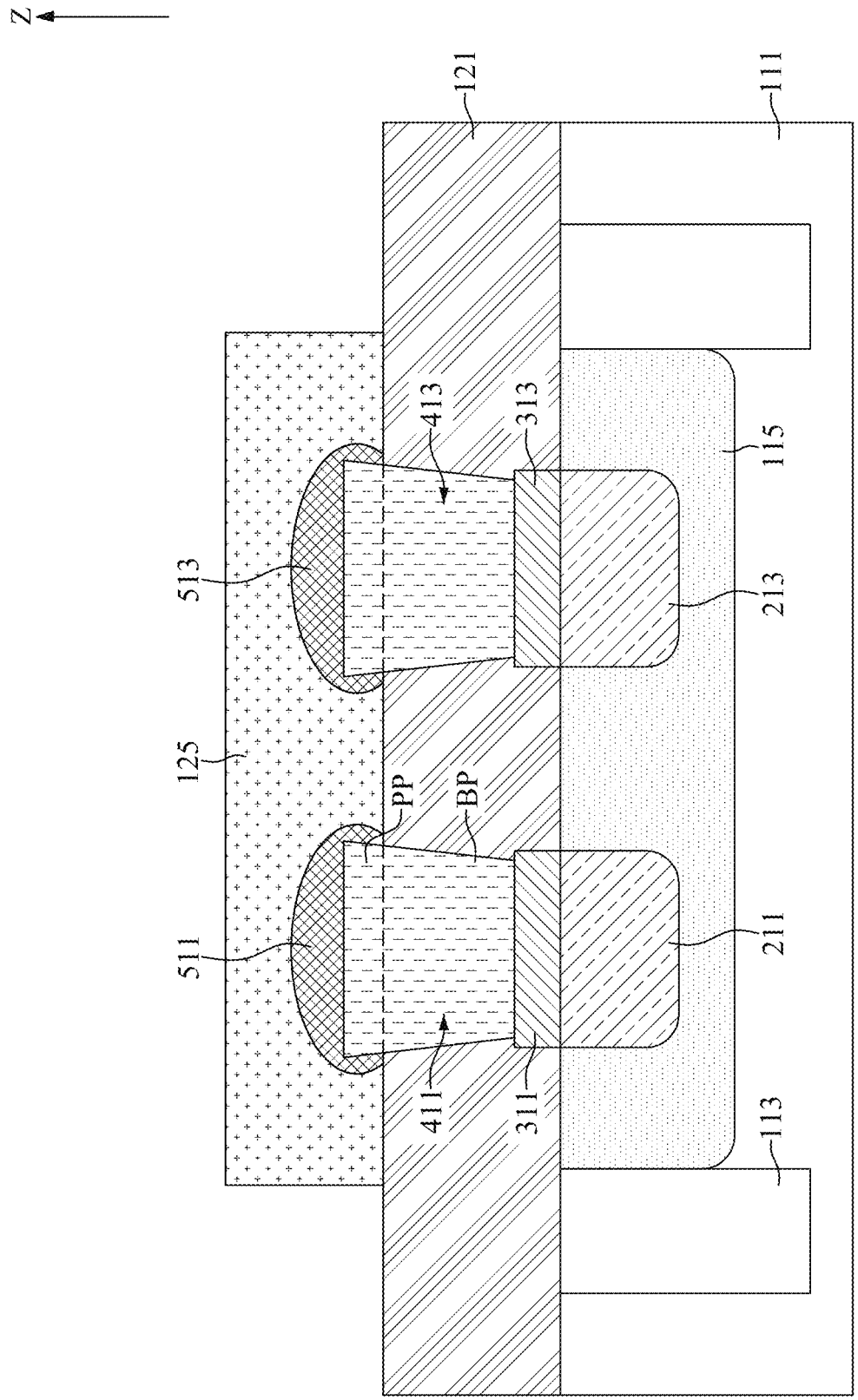
FIGS. 16 and 17 illustrate, in schematic cross-sectional view diagrams, part of a flow for fabricating a semiconductor device in accordance with another embodiment of the present disclosure.
Figure 17:
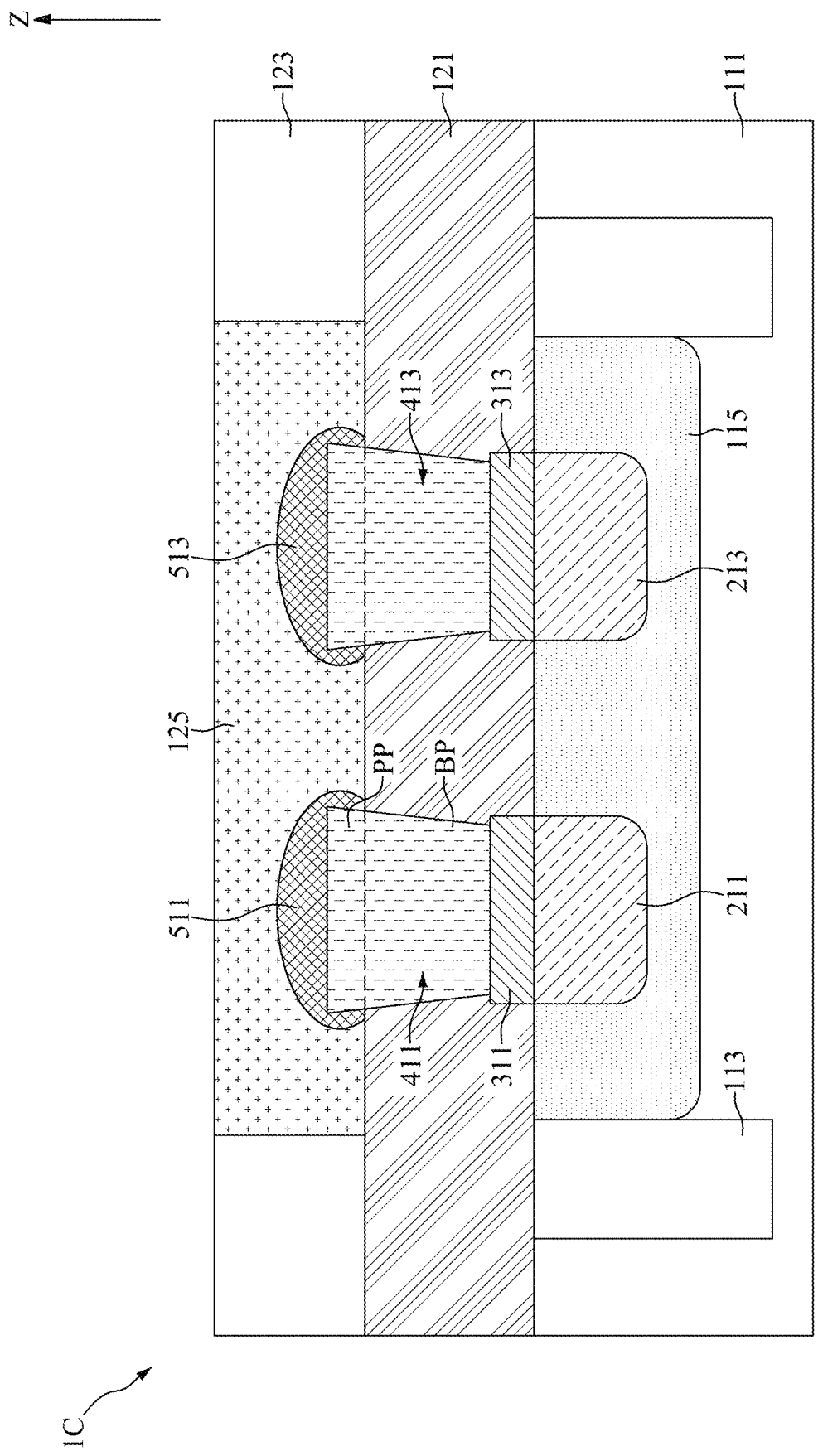

FIGS. 16 and 17 illustrate, in schematic cross-sectional view diagrams, part of a flow for fabricating a semiconductor device 1C in accordance with another embodiment of the present disclosure.

With reference to FIG. 16, an intermediate semiconductor device may be fabricated with a procedure similar to that illustrated in FIGS. 2 to 11, and descriptions thereof are not repeated herein.

With reference to FIG. 16, the first top conductive layer 125 may be formed on the first dielectric layer 121 and cover the plurality of top assistant caps 511, 513. In some embodiments, the first top conductive layer 125 may be formed by initially forming a seed layer (not separately shown in FIG. 16). The seed layer may be a thin layer of a conductive material that aids in the formation of a thicker layer during subsequent processing steps. The seed layer may include a layer of titanium about 1,000 Angstroms thick followed by a layer of copper about 5,000 Angstroms thick. The seed layer may be formed using processes such as sputtering, evaporation, or plasma-enhanced chemical vapor deposition, depending upon the desired materials. The seed layer may be formed to have a thickness of between about 0.3 jam and about 1 µm, such as about 0.5 jam.

Once the seed layer has been formed the first top conductive layer 125 may be formed over the seed layer. In some embodiments, the first top conductive layer 125 may include one or more conductive materials, such as copper, tungsten, other conductive metals, or the like, and may be formed, for example, by electroplating, electroless plating, or the like. In some embodiments, a photoresist (not separately shown in FIG. 16) may be placed on the seed layer and patterned to expose the seed layer where the first top conductive layer 125 is desired to be formed.

Once patterned, an electroplating process may be used wherein the seed layer and the photoresist are submerged or immersed in the electroplating solution. The seed layer surface may be electrically connected to the negative side of an external DC power supply such that the seed layer functions as the cathode in the electroplating process. A solid conductive anode, such as a copper anode, may be also immersed in the solution and may be attached to the positive side of the power supply. The atoms from the anode are dissolved into the solution, from which the cathode (e.g., the seed layer) acquires the dissolved atoms, thereby plating the exposed conductive areas of the seed layer within the opening of the photoresist. After the first top conductive layer 125 is formed, the photoresist may be removed.

With reference to FIG. 17, the second dielectric layer 123 may be formed on the first dielectric layer 121 and covering the first top conductive layer 125. The second dielectric layer 123 may be formed with a procedure similar to that illustrated in FIG. 12, and descriptions thereof are not repeated herein. A planarization process, such as chemical mechanical polishing, may be performed until the top surface of the first top conductive layer 125 is exposed to remove excess material and provide a substantially flat surface for subsequent processing steps.

One aspect of the present disclosure provides a semiconductor device including a substrate; a first impurity region positioned in the substrate; a first dielectric layer positioned on the substrate; a first contact including a buried portion positioned along the first dielectric layer and on the first impurity region, and a protruding portion positioned on the buried portion and protruding from the first dielectric layer; a first top assistant cap covering the protruding portion; and a first top conductive layer positioned on the first top assistant cap. The first top assistant cap includes germanium or silicon germanium.

Another aspect of the present disclosure provides a semiconductor device including a substrate; a plurality of impurity regions separately positioned in the substrate; a first dielectric layer positioned on the substrate; a plurality of contacts including a plurality of buried portions positioned along the first dielectric layer and respectively correspondingly on the plurality of impurity regions, and a plurality of protruding portions respectively correspondingly positioned on the plurality of buried portions and protruding from the first dielectric layer; a plurality of top assistant caps respectively correspondingly covering the plurality of protruding portions; and a first top conductive layer positioned on the plurality of top assistant caps. The plurality of top assistant caps include germanium or silicon germanium.

Another aspect of the present disclosure provides a method for fabricating a semiconductor device including providing a substrate; forming a first impurity region in the substrate; forming a first dielectric layer on the substrate; forming a first contact and including a buried portion in the first dielectric layer and on the first impurity region, and a protruding portion in the first dielectric layer and on the buried portion; recessing the first dielectric layer to expose the protruding portion; forming a first top assistant cap covering the protruding portion; and forming a first top conductive layer on the first top assistant cap. The first top assistant cap includes germanium or silicon germanium.

Due to the design of the semiconductor device of the present disclosure, the resistance between the first top conductive layer 125 and the plurality of contacts 411, 413 may be reduced by employing the plurality of top assistant caps 511, 513. In addition, the resistance between the plurality of impurity regions 211, 213 and the plurality of contacts 411, 413 may be reduced by employing the plurality of bottom assistant layers 311, 313. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first impurity region positioned in the substrate;
a first dielectric layer positioned on the substrate;
a first contact comprising:
  a buried portion positioned along the first dielectric layer and on the first impurity region; and
  a protruding portion positioned on the buried portion and protruding from the first dielectric layer;
a first top assistant cap covering the protruding portion;
a first top conductive layer positioned on the first top assistant cap; and
a first bottom assistant layer positioned between the first contact and the first impurity region;
wherein the first top assistant cap comprises germanium or silicon germanium;
wherein the first contact comprises silicon and/or germanium with substantially no oxygen and nitrogen;
wherein the first bottom assistant layer comprises an epitaxial material.

2. The semiconductor device of claim 1, wherein a thickness of the protruding portion of the first contact and a thickness of the first bottom assistant layer are different.

3. The semiconductor device of claim 1, wherein a thickness of the protruding portion of the first contact and a thickness of the first bottom assistant layer are substantially the same.

4. The semiconductor device of claim 1, wherein a thickness ratio of a thickness of the buried portion to a thickness of the protruding portion is between about 30 and about 5.

5. The semiconductor device of claim 1, wherein a width of a bottom surface of the first contact is less than a width of the first bottom assistant layer.

6. The semiconductor device of claim 5, wherein a sidewall of the first contact may be tapered.

7. The semiconductor device of claim 6, wherein the first dielectric layer comprises silicon oxide.

8. The semiconductor device of claim 7, further comprising a well region positioned in the substrate, wherein the first impurity region is positioned in the well region.

9. The semiconductor device of claim 8, wherein the well region and the first impurity region comprise different electrical types.

10. The semiconductor device of claim 1, wherein a width of the first bottom assistant layer and a width of the first impurity region are different.

11. The semiconductor device of claim 1, wherein a width of the first bottom assistant layer and a width of the first impurity region are substantially the same.

12. A semiconductor device, comprising:
a substrate;
a plurality of impurity regions separately positioned in the substrate;
a first dielectric layer positioned on the substrate;
a plurality of contacts comprising:
  a plurality of buried portions positioned along the first dielectric layer and respectively correspondingly on the plurality of impurity regions; and
  a plurality of protruding portions respectively correspondingly positioned on the plurality of buried portions and protruding from the first dielectric layer;
a plurality of top assistant caps respectively correspondingly covering the plurality of protruding portions;
a first top conductive layer positioned on the plurality of top assistant caps; and
a plurality of bottom assistant layers respectively correspondingly positioned between the plurality of impurity regions and the plurality of contacts;
wherein the plurality of top assistant caps comprise germanium or silicon germanium;
wherein the plurality of contacts comprise silicon and/or germanium with substantially no oxygen and nitrogen;
wherein the plurality of bottom assistant layers comprising an epitaxial material.

13. The semiconductor device of claim 12, wherein a thickness of the plurality of protruding portions and a thickness of the plurality of bottom assistant layers are different.

* * * * *